United States Patent [19]

Sameshima

[11] Patent Number: 5,325,050
[45] Date of Patent: Jun. 28, 1994

[54] MAXIMUM VOLTAGE DETECTING APPARATUS USING FERROELECTRIC CAPACITORS

[75] Inventor: Katsumi Sameshima, Kyoto, Japan
[73] Assignee: Rohm Co., Ltd., Kyoto, Japan
[21] Appl. No.: 958,684
[22] Filed: Oct. 9, 1992

[30] Foreign Application Priority Data

Oct. 30, 1991 [JP] Japan .................................. 3-284760
Nov. 1, 1991 [JP] Japan .................................. 3-287589
Nov. 1, 1991 [JP] Japan .................................. 3-287623

[51] Int. Cl.$^5$ .......................................... G01R 19/04
[52] U.S. Cl. ............................. 324/103 P; 324/133; 307/351; 340/662
[58] Field of Search ............ 324/102, 103 P, 133; 307/351; 340/659, 662, 664

[56] References Cited

U.S. PATENT DOCUMENTS

| | | | |
|---|---|---|---|
| 3,401,272 | 9/1968 | Rosa et al. | 324/102 |
| 3,947,761 | 3/1976 | Arai | 324/103 P |
| 4,262,257 | 4/1981 | Lawrence | 307/351 X |
| 4,706,289 | 11/1987 | Jensen | 324/103 P |
| 4,725,825 | 2/1988 | McKean | 340/660 |

Primary Examiner—Kenneth A. Wieder
Assistant Examiner—Glenn W. Brown

[57] ABSTRACT

A maximum voltage detecting apparatus for detecting the maximum voltage output from a light sensor, a wind force sensor or the like by using ferroelectric capacitors, and a method of producing ferroelectric capacitors. A plurality of ferroelectric capacitor devices each of which is composed of one ferroelectric capacitor or a plurality of ferroelectric capacitors which have approximately the same thickness and which are connected in series and are arranged in an array are connected in parallel so as to provide a ferroelectric unit. A DC voltage is applied to the ferroelectric unit so as to produce spontaneous polarization. An output voltage of a wind force sensor or the like is applied to the ferroelectric unit at the opposite polarity, and whether or not the polarization of each ferroelectric capacitor device is reversed is detected, thereby detecting the maximum value of the external voltage. Each ferroelectric capacitor is composed of first insulating film, lower electrode, ferroelectric film, second insulating film, and upper electrode which are laminated on a semiconductor substrate in that order.

19 Claims, 9 Drawing Sheets

MAXIMUM VOLTAGE DETECTING APPARATUS USING FERROELECTRIC CAPACITORS

BACKGROUND OF THE INVENTION

1. Field of the Invention

The present invention relates to a maximum voltage detecting apparatus using ferroelectric capacitors and, more particularly, to an apparatus for detecting the maximum voltage output from an apparatus for generating a potential such as a light sensor, a heat sensor or a pressure sensor by using ferroelectric capacitors and without the need for an external power supply, and to a method of producing ferroelectric capacitors.

2. Description of the Related Art

A light sensor, a heat sensor, a pressure sensor, a wind force sensor or the like generates a potential which corresponds to the light, the heat, the pressure or the like to be measured. A comparator such as a comparator 10 shown in FIG. 1 is used as a monitor for judging whether or not the potential has reached a predetermined value. The comparator 10 is generally composed of a current mirror circuit 10a and a differentiating circuit 10b, and a voltage which corresponds to the difference between the output at the non-inverting input terminal and the output at the inverting input terminal is taken out as an output. An apparatus for generating a potential such as a light sensor or a heat sensor is connected to the non-inverting input terminal, and a reference voltage is applied to the inverting terminal so as to judge whether or not an external voltage such as the voltage of a light sensor or a heat sensor has reached the reference voltage.

A conventional voltage measuring apparatus such as a comparator, however, cannot be operated unless power is supplied from an external power source 10c. In addition, in order to constantly monitor the maximum voltage, it is also necessary to connect an external memory to the output terminal of the comparator, which inconveniently makes the structure of the voltage measuring apparatus complicated.

SUMMARY OF THE INVENTION

Accordingly, it is an object of the present invention to eliminate the above-described problems in the related art and to provide a maximum voltage detecting apparatus using ferroelectric capacitors which is capable of nonvolatile measurement of the maximum voltage without the need for an external power supply, and a method of producing ferroelectric capacitors.

To achieve this aim, a maximum voltage detecting apparatus according to the present invention comprises: a ferroelectric unit which is composed of a plurality of ferroelectric capacitor devices which are connected in parallel, each ferroelectric capacitor device being composed of one ferroelectric capacitor or a plurality of ferroelectric capacitors which have approximately the same thickness and which are connected in series and are arranged in an array; a resetting circuit for applying a predetermined voltage to the ferroelectric unit so as to generate the maximum spontaneous or induced polarization on each ferroelectric capacitor in the ferroelectric unit; and a polarization detector for detecting the residual polarization in each of the ferroelectric capacitor devices, which is caused by an external voltage to be measured at the opposite polarity to that of the predetermined voltage.

As is well known, a ferroelectric material is one of the dielectrics which have spontaneous or induced polarization based on the permanent bipolar moment. A ferroelectric material is characterized by the fact that it is possible to reverse the polarization direction thereof by applying an electric field thereto. In other words, a ferroelectric material has a characteristic approximate to the B-H curve of a ferromagnetic material. In the present invention, by utilizing this characteristic, spontaneous polarization in one direction is produced on a ferroelectric capacitor, and the spontaneous polarization is reversed by an external voltage so as to generate the residual polarization. On the basis of the residual polarization, the maximum voltage is detected.

The ferroelectric unit in the present invention is composed of a plurality of ferroelectric capacitor devices which are connected in parallel. Each ferroelectric capacitor device is composed of one ferroelectric capacitor or a plurality of ferroelectric capacitors which have approximately the same thickness and which are connected in series and are arranged in an array. Therefore, the total thickness of the ferroelectric material is different in the respective ferroelectric capacitor devices depending upon the number of ferroelectric capacitors which are connected in series. The larger the number is, the thicker the ferroelectric material.

If the thicknesses of the ferroelectric materials are different in the respective ferroelectric capacitor devices, although the maximum spontaneous polarization is approximately the same, the value of the field resistance which is necessary in order to reverse the spontaneous polarization increases in proportion to the thickness of the ferroelectric material. Consequently, if an external voltage is applied to the ferroelectric unit at the opposite polarity to that of the predetermined voltage, if the external voltage is not lower than the field resistance of a ferroelectric capacitor device, the spontaneous polarization is reversed. On the other hand, if it is lower than the field resistance, the spontaneous polarization is not reversed. It is therefore possible to detect the maximum value of the external voltage applied to the ferroelectric unit by judging whether or not the respective ferroelectric capacitor devices are reversed.

A method of producing ferroelectric capacitors according to the present invention comprises the steps of: forming a first insulating film on a semiconductor substrate; forming a first metal film on the first insulating film; forming a plurality of lower electrodes by etching the first metal film; forming a ferroelectric film on the lower electrodes; forming a second insulating film on the ferroelectric film; forming contact holes which come into contact with the ferroelectric film by etching the second insulating film; forming a second metal film on the second insulating film; and forming a plurality of upper electrodes on the respective contact holes by etching the second metal film.

Each ferroelectric capacitor is composed of two metal films and a ferroelectric material sandwiched therebetween. In the present invention, lower electrodes are first formed on a semiconductor substrate, and a ferroelectric film is formed on the lower electrodes. An insulating film having contact holes in the regions in which ferroelectric capacitor are to be formed is then formed. By forming a plurality of upper electrodes on the respective contact holes, a multiplicity of ferroelectric capacitors which are composed of the ferroelectric materials sandwiched between the upper electrodes and the lower electrodes are produced.

What is required in order to connect these multiplicity of ferroelectric capacitors in series or in parallel is only to connect an upper electrode or a lower electrode to an adjacent ferroelectric capacitor, as occasion demands.

The present invention also provides a method of producing ferroelectric capacitors comprising the steps of: forming a first insulating film on a semiconductor substrate; forming a first metal film on the first insulating film; forming lower electrodes by etching the first metal film; forming an interlayer insulating film on the lower electrodes; forming contact holes which come into contact with the lower electrodes by etching the interlayer insulating film; forming a ferroelectric film on the interlayer insulating film: etching the ferroelectric film so as to separate the ferroelectric film portions in the contact holes from each other; forming a second metal film on the ferroelectric film portions which are separate from each other; and forming upper electrodes on the respective contact holes by etching the second metal film.

In this manufacturing method, lower electrodes are first formed on a semiconductor substrate and an interlayer insulating film is then formed on the lower electrodes. Contact holes are formed in the interlayer insulating film, and a ferroelectric film is formed on the contact holes. The ferroelectric films are etched so as to form ferroelectric materials in the respective contact holes. By forming upper electrodes on the contact holes, a multiplicity of ferroelectric capacitors which are composed of the ferroelectric film materials sandwiched between the upper electrodes and the lower electrodes are produced.

The above and other objects, features and advantages of the present invention will become clear from the following description of preferred embodiments thereof, taken in conjunction with the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Embodiments of the present invention will be explained hereinunder with reference to the accompanying drawings.

Figure 1:
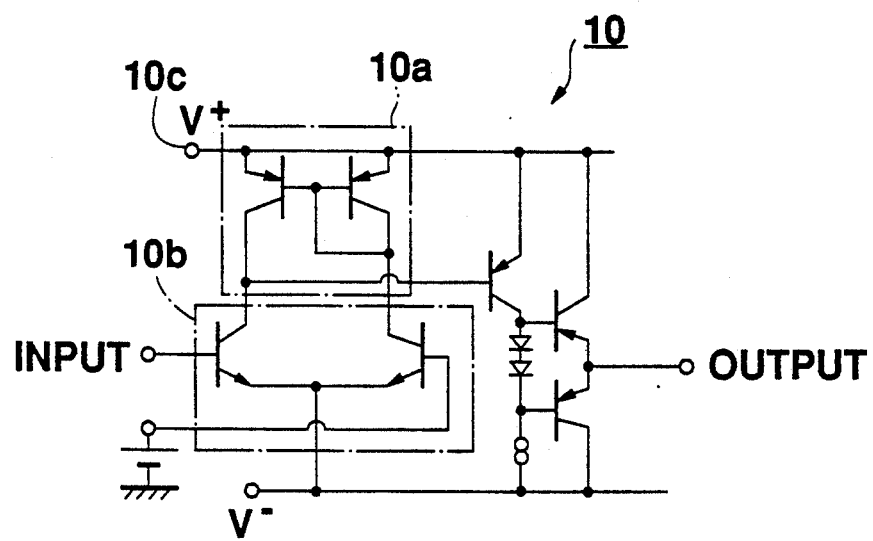
FIG. 1 shows the structure of a conventional maximum voltage detecting apparatus.
Figure 2:
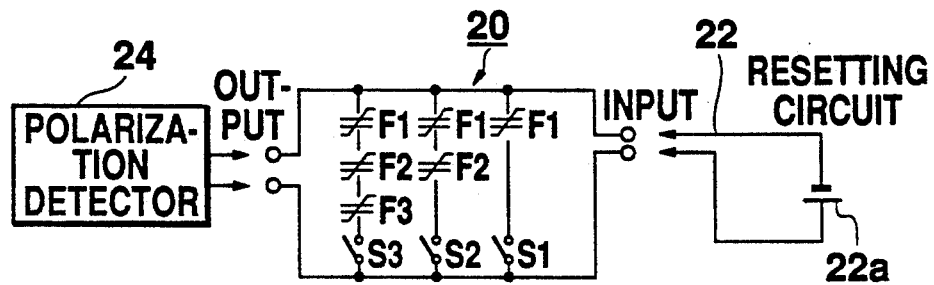
FIG. 2 shows the entire structure of an embodiment of a maximum voltage detecting apparatus according to the present invention.
Figure 3:
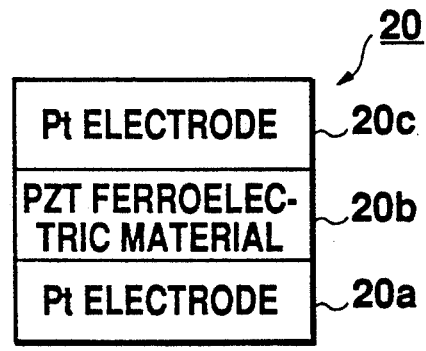
FIG. 3 shows the structure of a ferroelectric capacitor shown in FIG. 2.

FIG. 2 shows the entire structure of an embodiment of a maximum voltage detecting apparatus according to the present invention. A plurality of (3 in this embodiment) ferroelectric capacitor devices are connected in parallel with each other, thereby constituting a ferroelectric unit 20. A first ferroelectric capacitor device is composed of one ferroelectric capacitor F1, a second ferroelectric capacitor device is composed of two ferroelectric capacitors $F_1$ and $F_2$ which are connected in series, and a third ferroelectric capacitor device is composed of three ferroelectric capacitors $F_1$, $F_2$ and $F_3$ which are connected in series. All the ferroelectric capacitors $F_1$ to $F_3$ have the same thickness. Each ferroelectric capacitor is composed of a PZT (lead zirconic titanate) ferroelectric material having a predetermined thickness and sandwiched between Pt electrodes 20a and 20c, as shown in FIG. 3. Switches S1 to S3 are connected in series to the respective ferroelectric capacitor devices.

A resetting circuit 22 for producing spontaneous polarization on the ferroelectric unit 20 is provided. A DC voltage is applied from a DC source 22a to the PZT ferroelectric material 20b through the Pt electrodes 20a, 20c of the ferroelectric capacitors $F_1$ to $F_3$, thereby producing the maximum spontaneous or induced polarization Pr. Since the first ferroelectric capacitor device is composed of the one ferroelectric capacitor $F_1$, the film thickness of the ferroelectric material is equal to the thickness of the PZT ferroelectric material 20b of the ferroelectric capacitor $F_1$. On the other hand, since the second ferroelectric capacitor device is composed of the two ferroelectric capacitors $F_1$ and $F_2$ the total film thickness of the ferroelectric material is equal to twice the thickness of the PZT ferroelectric material 20b of the ferroelectric capacitor $F_1$. Since the third ferroelectric capacitor device is composed of the three ferroelectric capacitors $F_1$, $F_2$ and $F_3$, the total film thickness of the ferroelectric material is equal to three times the thickness of the PZT ferroelectric material 20b of the ferroelectric capacitor $F_1$.

Figure 6:
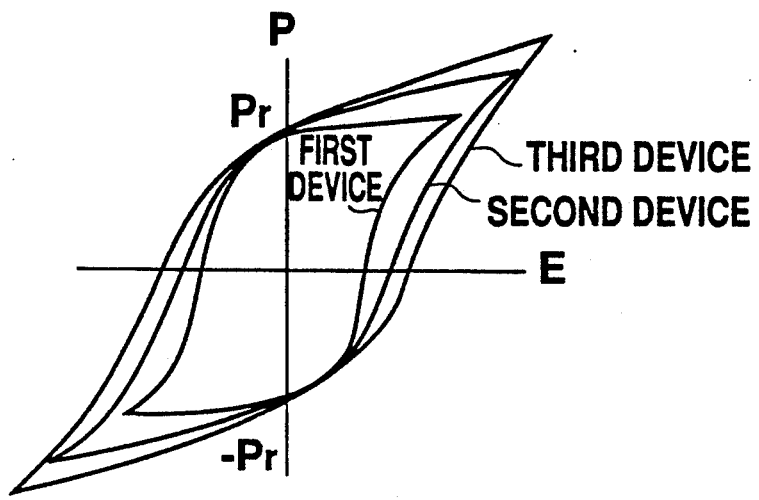
FIG. 6 show the P-E hysteresis loops of the ferroelectric capacitor devices shown in FIG. 2.

FIG. 6 shows the P-E hysteresis loops of the respective ferroelectric capacitor devices. As is clear from FIG. 6, although the maximum spontaneous or induced polarizations Pr of the first, second and third ferroelectric capacitor devices are approximately the same, the field strength which is necessary in order to reverse the polarization, namely, the field resistance increases in proportion to the increase in total film thickness of the ferroelectric material. Therefore, in the case of producing the maximum spontaneous or induced polarization Pr by the DC power source 22a of the resetting circuit 22, it is necessary to apply an adequate electric field for producing the maximum spontaneous polarization to the third ferroelectric capacitor device which has the largest film thickness.

After the maximum spontaneous or induced polarizations Pr are produced on all the ferroelectric capacitors in the ferroelectric unit 20 by the resetting circuit 22 in this way, an external voltage to be measured is connected to the ferroelectric unit 20 at the opposite polarity, and the maximum value of the external voltage is measured. The process for calculating the maximum voltage will now be explained while taking the measurement of the voltage from a wind force sensor as an example.

Figure 4:
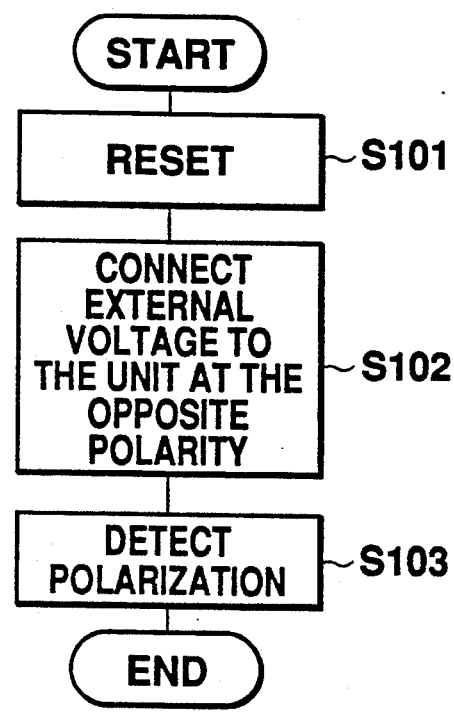
FIG. 4 is a flowchart of the detecting operation of the embodiment shown in FIG. 2.
Figure 5:
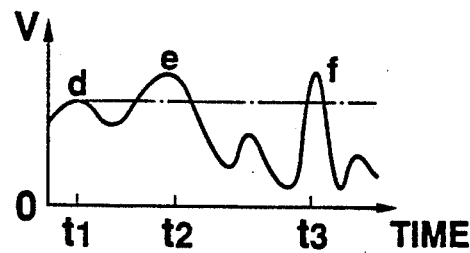
FIG. 5 is a graph showing the output characteristic of the embodiment shown in FIG. 2 and applied to a wind force sensor.

FIG. 4 is a flowchart of the measuring process in this embodiment. The maximum spontaneous or induced polarization Pr is first produced on each of the ferroelectric capacitors $F_1$ to $F_3$ in the ferroelectric unit 20 by using the resetting circuit 22 at step S101. The voltage output from the wind force sensor is then connected to the ferroelectric unit 20 at the opposite polarity to that of the resetting circuit 22 at step S102. At this time, all of the switches $S_1$ to $S_3$ which are connected to the respective ferroelectric capacitor devices are turned ON. FIG. 5 shows an example of an output voltage characteristics of the wind force sensor. The abscissa represents time, and the ordinate represents output voltage. The wind force sensor used in this embodiment outputs the peak voltages d, e and f at the times $t_1$, $t_2$ and $t_3$, respectively. When the output voltage having this characteristic is applied to each of the ferroelectric capacitors $F_1$ to $F_3$, the spontaneous or induced polarization of each ferroelectric capacitor device changes along the corresponding P-E hysteresis.

Figure 7:
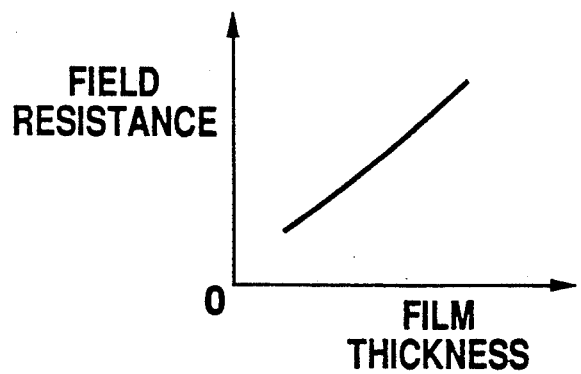
FIG. 7 is a graph showing the relationship between the thickness and the field resistance of a ferroelectric capacitor device shown in FIG. 2.

Since the field resistance which reverses the polarization increases approximately in proportion to the film thickness of a PZT ferroelectric material, as shown in FIG. 7, when the output voltage of the wind force sensor reaches the maximum value f, if the field strength which corresponds to f is not lower than the field resistance, the polarization is reversed. In this embodiment, since the film thickness of the first ferroelectric capacitor device is the smallest and the film thickness of the third ferroelectric capacitor device is the largest, the ferroelectric unit 20 assumes one of the following three modes:

(1) no reverse polarization is produced on any of the first, second and third ferroelectric capacitor devices;

(2) the polarization of one of the first, second and third ferroelectric capacitor devices is reversed (the polarization is decreasingly less difficult to reverse in the order of the third, second and first ferroelectric capacitor devices); and (3) all the polarizations of the first, second and third ferroelectric capacitor devices are reversed.

The output terminal of the ferroelectric unit 20 is then connected to a polarization detector 24, and the switches $S_1$ to $S_3$ are successively turned ON so as to judge whether or not the polarization of the respective ferroelectric capacitor devices are reversed at step S103. In this way, the maximum output voltage of the wind force sensor is detected.

Figure 8A:
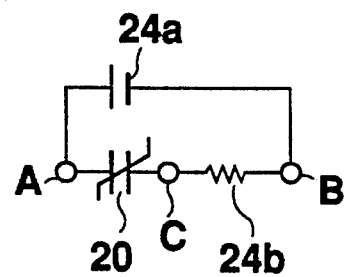
FIGS. 8A and 8B are explanatory views of the detection of the residual polarization in the embodiment shown in FIG. 2.
Figure 8B:
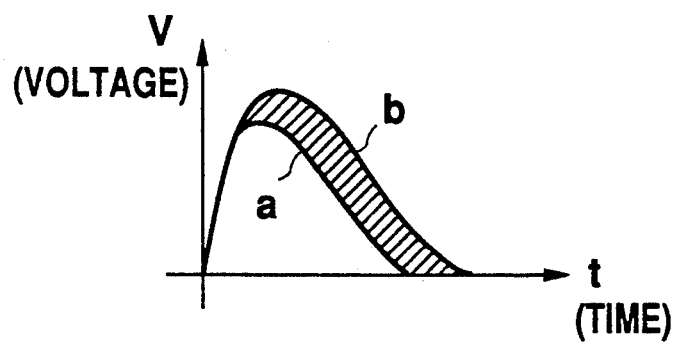

FIGS. 8A and 8B are a circuit diagram of the polarization detector 24 and an explanatory view of the principle of detection of polarization, respectively, in this embodiment. The polarization detector 24 is composed of a DC power source 24a for producing the maximum spontaneous or induced polarization on a ferroelectric capacitor, and a resistor 24b. The residual polarization is detected by monitoring the voltage or the current between the points B and C.

More specifically, a voltage is applied between the points A and B so as to produce the maximum polarization on a ferroelectric capacitor and a change in the voltage between the points B and C is measured. If the polarization of the ferroelectric capacitor is reversed and the ferroelectric capacitor already has the maximum spontaneous or induced polarization Pr, the voltage changes as indicated by the curve a in FIG. 8B. On the other hand, if the residual polarization of the ferroelectric capacitor is not completely reversed, the voltage changes as indicated by the curve b in FIG. 8B. This is because the voltage changes along the P-E hysteresis when the ferroelectric capacitor already has the maximum spontaneous or induced polarization, and in the other cases, the voltage does not change along the P-E hysteresis loop.

That is, when the residual polarization is not the maximum spontaneous or induced polarization, the voltage (or current) changes as indicated by the curve b. It is therefore possible to obtain the residual polarization by applying a predetermined voltage between the points A and B twice and obtaining the difference (hatched portion in FIG. 8B) between the two voltages (currents). When the residual polarization already reaches the maximum spontaneous or induced polarization Pr, the difference is 0, and in the other cases the difference is proportional to the residual polarization.

Figure 9:
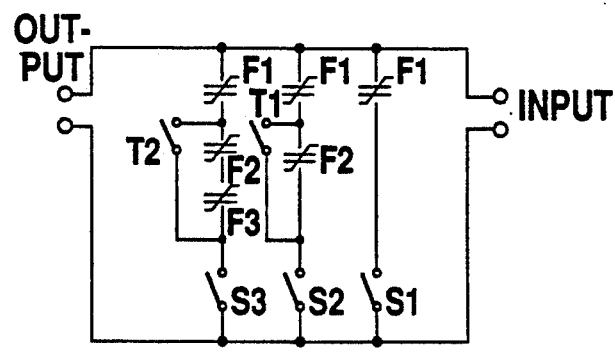
FIG. 9 shows the entire structure of another embodiment of a maximum voltage detecting apparatus according to the present invention.

It is necessary to change the voltage of the DC power source for producing the maximum spontaneous or induced polarization on each ferroelectric capacitor device in correspondence to the film thickness of the ferroelectric material. In this embodiment, the voltage of the DC power source 24a of the polarization detector 24 is therefore the same as the voltage of the DC power source 22a of the resetting circuit 22. In another embodiment shown in FIG. 9, however, switches $T_1$ and $T_2$ are provided on the second ferroelectric capacitor device and the third ferroelectric capacitor device, respectively. In the case of measuring the reversed polarization of the first ferroelectric capacitor device, the switch $S_1$ is closed, and a DC voltage is applied to the ferroelectric capacitor $F_1$. In the case of measuring the reversed polarization of the second ferroelectric capacitor device, the switches $S_2$ and $T_1$ are turned ON, and the reversed polarization of only the ferroelectric capacitor $F_1$ in the second device is measured. In the case of measuring the reversed polarization of the third ferroelectric capacitor device, the switches $S_3$ and $T_2$ are turned ON, and the reversed polarization of only the ferroelectric capacitor $F_1$ in the third device is measured.

In this way, when the reversed polarization of each ferroelectric capacitor device is measured, a DC voltage is applied not to all the ferroelectric capacitors but only the ferroelectric capacitor $F_1$, which is included in each ferroelectric capacitor device. Consequently, the DC power source 24a of the polarization detector 24 is required to have only a low voltage, thereby facilitating the measurement.

In these embodiments, since ferroelectric capacitor devices having substantially different film thicknesses are realized by connecting a plurality of ferroelectric capacitors $F_1$ to $F_3$ having approximately the same thickness in series, the manufacture of the ferroelectric capacitor devices is facilitated without the need for minute processing for changing the film thickness of the PZT ferroelectric material.

Although three ferroelectric capacitor devices are used in these embodiments, it goes without saying that the number of ferroelectric capacitor devices may be increased, if necessary, and that the number of ferroelectric capacitors which are connected in series may also be increased, if necessary.

Embodiments of a method of producing ferroelectric capacitors $F_1$ to $F_3$ used in the above embodiments will be explained hereinunder with reference to the accompanying drawings.

Figure 10A:
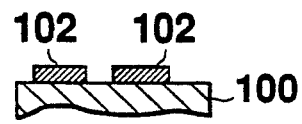
FIGS. 10A to 10C show an embodiment of a method of producing ferroelectric capacitors according to the present invention.
Figure 10B:
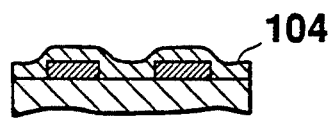
Figure 10C:
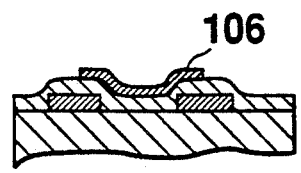

In the embodiment shown in FIGS. 10A, 10B and 10C, a Pt film 102 which constitutes lower electrodes is first formed on a silicon substrate 100 by sputtering or the like, as shown in FIG. 10A. The lower electrodes 102 are coated with a PZT film 104, as shown in FIG. 10B, and the composite is baked at a predetermine temperature. Thereafter, a Pt film 106 which constitutes upper electrodes is formed by sputtering or the like such that some portions are situated over the lower electrodes 102.

In the PZT film 104, only the regions which are sandwiched between the upper and lower Pt films 102 and 106 function as the ferroelectric capacitors. In this way, a plurality of ferroelectric capacitors are produced without the need for a process of etching the PZT film 104.

Figure 11:
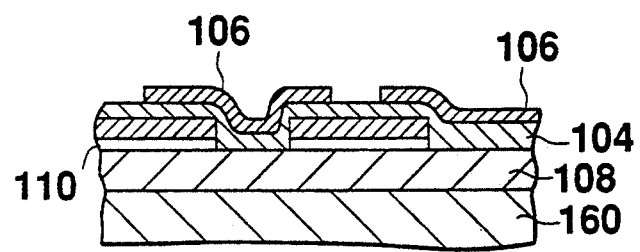
FIG. 11 shows another embodiment of a method of producing ferroelectric capacitors according to the present invention.

FIG. 11 shows another embodiment of a method of producing ferroelectric capacitors according to the present invention. A silicon oxide film 108 is formed on a silicon substrate 160 by thermal oxidation or the like. Ti film 110 and the Pt film 102 are formed on the silicon oxide film 108 in that order as lower electrodes by sputtering or the like. The other processes are the same as in the embodiment shown in FIGS. 10A to. 10C. In other words, the lower electrodes in this embodiment have a two-layer structure.

Figure 12A:
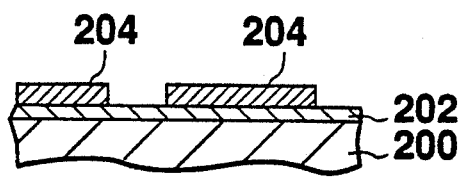
FIGS. 12A to 12D shows still another embodiment of a method of producing ferroelectric capacitors according to the present invention.

FIGS. 12A to 12D show still another embodiment of a method of producing ferroelectric capacitors according to the present invention. A silicon oxide film 202 is first formed on a silicon substrate 200 by thermal oxidation as a first insulating film, as shown in FIG. 12A. A Pt film is formed on the silicon oxide film 202 as a first metal film by sputtering, and unnecessary portions are removed by etching so as to form lower electrodes 204.

Figure 12B:
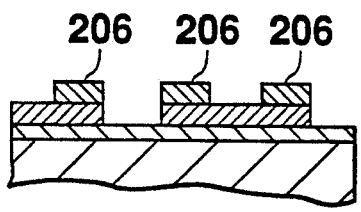

Thereafter, a PZT ferroelectric film is formed by sputtering and the composite is baked at a predetermined temperature. Unnecessary portions are removed from the PZT film by etching, thereby forming PZT ferroelectric materials 206 on the lower electrodes 204, as shown in FIG. 12B.

Figure 12C:
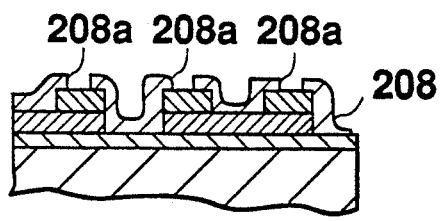

A silicon oxide film 208 is then formed as a second insulating film by CVD or the like, and the portions on the PZT ferroelectric materials 206 are removed by etching, thereby forming contact holes 208A, as shown in FIG. 12C.

Figure 12D:
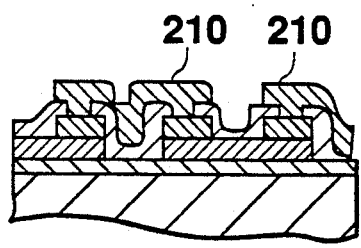

A Pt film is finally formed on the silicon oxide film 208 as a second metal film by sputtering or the like, and unnecessary portions are removed by etching so as to form upper electrodes 210, as shown in FIG. 12D. In the regions in which the contact holes 208a are formed, the PZT ferroelectric materials 206 are sandwiched between the upper electrodes 210 and the lower electrodes 204. These portions therefore function as ferroelectric capacitors. If the upper electrodes 210 or the lower electrodes 204 are formed in such a manner that the adjacent ferroelectric capacitors have a common upper electrode or lower electrode, as shown in FIG. 12D, it is possible to connect the ferroelectric capacitors in series. In this embodiment, three ferroelectric capacitors are connected in series.

In this way, by forming a plurality of ferroelectric capacitors having approximately the same thickness on the silicon substrate 200 and connecting a desired number of ferroelectric capacitors in series, it is possible to substantially vary the thickness of the ferroelectric material.

Figure 13A:
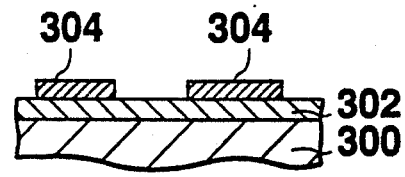
FIGS. 13A to 13E show a further embodiment of a method of producing ferroelectric capacitors according to the present invention.

FIGS. 13A to 13E show a further embodiment of a method of producing ferroelectric capacitors. A silicon oxide film 302 is first formed on a silicon substrate 300 by thermal oxidation as a first insulating film, as shown in FIG. 13A. A Pt film is formed as a first metal film on the silicon oxide film 302 by sputtering or the like, and unnecessary portions are removed by etching so as to form lower electrodes 304.

Figure 13B:
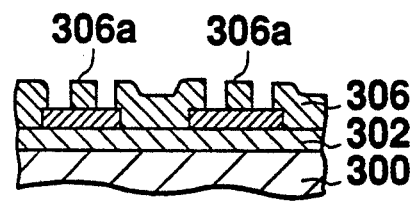

Thereafter, a silicon oxide film 306 is formed as an interlayer insulating film by CVD or the like in such a manner as to cover the lower electrodes 304 and the silicon oxide film 302, and contact holes 306a are formed on the lower electrodes 304 by etching, as shown in FIG. 13B. Each contact hole 306a is so designed as to have an opening area large enough to produce the residual polarization which is necessary for the ferroelectric capacitor.

Figure 13C:
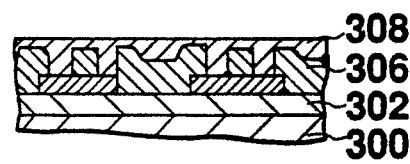

A PZT film 308 is then formed as a ferroelectric film on the silicon oxide film 306, as shown in FIG. 13C. In this embodiment, a sol-gel method is adopted for forming the PZT film 308. In other words, a sol solution of PZT is applied to the silicon oxide film 306 by spin coating, and the composite is baked at a predetermined temperature (70° C.) for about 30 minutes and then at 400° C. for about 30 minutes to evaporate the solvent of PZT. Thereafter, the temperature is raised to about 600° C. to crystallize PZT and finally to form the PZT film 308 on the silicon oxide film 306.

Figure 13D:
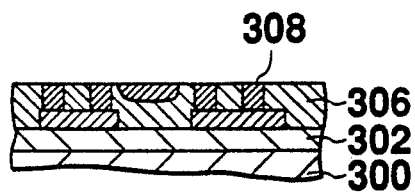

The PZT film 308 is then etched to uniformly remove the PZT film until the PZT film portions 308 in the contact holes 306a are separated from each other, as shown in FIG. 13D. At this time, the PZT film 308 may remain outside of the contact holes 306a.

Figure 13E:
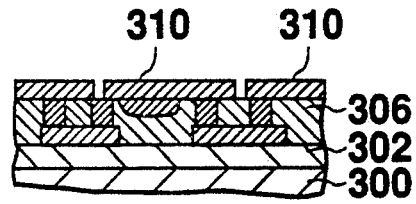

Finally, a Pt film is formed as a second metal film by sputtering or the like, and unnecessary portions are removed by etching so as to form upper electrodes 310 on the contact holes 306a, as shown in FIG. 13E. In the regions in which the contact holes 306a are formed, the PZT ferroelectric film portions 308 are sandwiched between the upper electrodes 310 and the lower electrodes 304. These portions therefore function as ferroelectric capacitors. The capacitance of the ferroelectric capacitor is determined by the dielectric constant of the PZT film and the opening area of the contact hole 306a. If the upper electrodes 310 or the lower electrodes 304 are formed in such a manner that the adjacent ferroelectric capacitors have a common upper electrode or lower electrode, as shown in FIG. 13E, it is possible to connect the ferroelectric capacitors in series. In this embodiment, four ferroelectric capacitors are connected in series.

In this way, by forming a plurality of ferroelectric capacitors having approximately the same thickness (determined by the depth of the contact hole 306a) on the silicon substrate 300 and connecting a desired number of ferroelectric capacitors in series, it is possible to substantially vary the thickness of the ferroelectric material.

Although a sol-gel method is adopted for forming the PZT film 308 in this embodiment, the method is not restricted thereto. For example, it is possible to form the PZT film portions 308 in the contact holes 306a by forming a PZT film 308 on the silicon oxide film 306 by some method, making the surface of the PZT film 308 flat by a photoresist or SOG, and thereafter uniformly etching the surface of the PZT film 308.

While there has been described what are at present considered to be preferred embodiments of the invention, it will be understood that various modifications as would be obvious to one of ordinary skill in the art may be made thereto, and it is intended that the appended claims cover all such modifications as fall within the true spirit and scope of the invention.

What is claimed is:

1. A maximum voltage detecting apparatus using ferroelectric capacitors comprising:
   (a) a ferroelectric unit which includes a plurality of ferroelectric capacitor devices which are connected in parallel, each ferroelectric capacitor device including at least one ferroelectric capacitor, each capacitor having approximately the same thickness and being connected in series and arranged in an array;
   (b) a resetting circuit for applying a predetermine voltage to said ferroelectric unit so as to generate a maximum induced polarization on each ferroelectric capacitor in said ferroelectric unit; and
   (c) a polarization detector for detecting the residual polarization in each of said ferroelectric capacitor devices, the residual polarization having been caused by applying to the ferroelectric unit an external voltage to be measured, opposite in polarity to said predetermined voltage.

2. A maximum voltage detecting apparatus according to claim 1, wherein said ferroelectric capacitors each include:
   a semiconductor substrate;
   a plurality of lower electrodes formed on said semiconductor substrate;
   a ferroelectric film formed on said lower electrodes;
   an insulating film formed on said ferroelectric film and having contact holes on said ferroelectric film; and
   upper electrodes formed on said insulating film in such a manner as to connect said contact holes.

3. A peak voltage detecting apparatus comprising:
   a first ferroelectric capacitor device having an alpha and beta terminal;
   a first switch, having an alpha and beta terminal, the beta terminal of the first device is connected to the alpha terminal of the first switch;
   a second ferroelectric capacitor device, having an alpha and beta terminal, the alpha terminals of the first and second devices, respectively, being connected together, the second device having a greater degree of maximum polarization than a maximum polarization of the first device; and
   a second switch, having an alpha and beta terminal, the beta terminal of the second device being connected to the alpha terminal of the second switch, and the beta terminals of the first and second switches, respectively, are connected together,
   said peak voltage being detected after applying an external voltage to be measured across the alpha terminals of the devices and the beta terminals of the switches, respectively, while the respective switches are closed, a preset polarization on each of the devices being changed as a function of a peak value attained by the external voltage, the peak voltage being stored as a function of different amounts of polarization change affected in each device.

4. An apparatus as in claim 3, wherein:
   the polarization of the second device substantially equals a constant coefficient of two multiplied by the polarization of the first device.

5. An apparatus as in claim 3, further comprising:
   a third ferroelectric capacitor device, having an alpha and beta terminal, the alpha terminals of the first, second, and third devices, respectively, are connected together, the third device having a greater degree of maximum polarization than the second device; and
   a third switch, having an alpha and beta terminal, the beta terminal of the third device is connected to the alpha terminal of the third switch, and the beta terminals of the first, second, and third switches, respectively, are connected together.

6. An apparatus as in claim 5, wherein:
   the polarization of the second device substantially equals a constant coefficient of two multiplied by the polarization of the first device; and
   the polarization of the third device substantially equals a constant coefficient of three multiplied by the polarization of the first device.

7. An apparatus as in claim 3, wherein the ferroelectric devices each comprise:
   at least one ferroelectric capacitor,
   wherein differing maximum polarizations of the devices is a function of differing degrees of maximum polarization of each capacitor, respectively.

8. An apparatus as in claim 7, wherein:
   each capacitor has substantially the same degree of maximum polarization, the differing polarization maximums of the devices is a function of a number of capacitors connected in series between the alpha and beta terminals of the devices, respectively.

9. An apparatus as in claim 8, wherein:
   the first device including one capacitor and the second device including a primary and secondary capacitor,
   such that the polarization of the second device substantially equals a constant coefficient of two multiplied by the polarization of the first device.

10. An apparatus as in claim 9, wherein:
    the two capacitors of the second device each have an alpha and beta terminal, the alpha terminal of the primary capacitor is connected to the alpha terminal of the first device, the beta terminal of the primary capacitor is connected to the alpha terminal of the secondary capacitor at a fourth junction, and the beta terminal of the secondary capacitor is connected to the alpha terminal of the second switch, wherein the second device further comprises a fourth switch, having an alpha and beta terminal, the beta terminal of the fourth switch is connected to the alpha terminal of the second switch and the alpha terminal of the fourth switch is connected to the fourth junction, for selectively bypassing the secondary capacitor.

11. An apparatus as in claim 10, further comprising:
a third ferroelectric capacitor device, having an alpha and beta terminal, the alpha terminals of the first, second, and third devices, respectively, are connected together, the third device having a greater degree of maximum polarization than the second device; and
a third switch, having an alpha and beta terminal, the beta terminal of the third device is connected to the alpha terminal of the third switch, and the beta terminals of the first, second, and third switches, respectively, are connected together,
the third device including a primary, secondary, and tertiary capacitor,
the three capacitors of the third device each having an alpha and beta terminal, the alpha terminal of the primary capacitor is connected to the alpha terminal of the first device, the beta terminal of the primary capacitor is connected to the alpha terminal of the secondary capacitor at a fifth junction, the beta terminal of the secondary capacitor is connected to the alpha terminal of the tertiary capacitor, the beta terminal of the tertiary capacitor is connected to the alpha terminal of the third switch,
wherein the third device further comprises a fifth switch, having an alpha and beta terminal, the beta terminal of the fifth switch is connected to the alpha terminal of the third switch and the alpha terminal of the fifth switch is connected to the fifth junction, for selectively bypassing the secondary and tertiary capacitors.

12. An apparatus as in claim 9, wherein:
each capacitor is substantially the same thickness.

13. An apparatus as in claim 7, wherein each ferroelectric capacitor comprises:
a plurality of lower electrodes;
a ferroelectric film deposited on the lower electrodes; and
a plurality of upper electrodes deposited on the ferroelectric film.

14. An apparatus as in claim 3, wherein:
the external voltage is a varying voltage.

15. An apparatus as in claim 3, further comprising:
a resetting circuit, selectively connected to the alpha terminals of the devices, respectively, and the beta terminals of the switches, respectively, that initially applies a resetting voltage to reset each device to its maximum polarization while its switch is closed, respectively.

16. An apparatus as in claim 15, wherein:
the external voltage is opposite in polarity to the resetting voltage.

17. An apparatus as in claim 3, further comprising:
a polarization detector, selectively connected to the alpha terminals of the devices, respectively, and the beta terminals of the switches, respectively, that detects reversal of the polarization of each device, respectively,
the detector determining peak voltage as a function of which of the devices has had its polarity reversed, respectively.

18. An apparatus as in claim 17, wherein the polarization detector:
detects peak voltage as a function of a degree to which each of the devices has had its polarity reversed.

19. An apparatus as in claim 17, wherein the polarization detector:
detects whether a particular device has had its polarization reversed by selectively closing its corresponding switch.

* * * * *